United States Patent
Chudzik et al.

(10) Patent No.: US 9,006,064 B2
(45) Date of Patent: Apr. 14, 2015

(54) MULTI-PLASMA NITRIDATION PROCESS FOR A GATE DIELECTRIC

(71) Applicant: International Business Machines Corporation, Armonk, NY (US)

(72) Inventors: Michael P. Chudzik, Danbury, CT (US); Barry P. Linder, Hastings-on-Hudson, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/793,804

(22) Filed: Mar. 11, 2013

(65) Prior Publication Data

US 2014/0252503 A1    Sep. 11, 2014

(51) Int. Cl.
*H01L 21/02* (2006.01)
*H01L 27/088* (2006.01)

(52) U.S. Cl.
CPC .......... *H01L 21/0214* (2013.01); *H01L 27/088* (2013.01)

(58) Field of Classification Search
CPC ............... H01L 21/3185; H01L 21/02274
USPC .................. 438/763, 775; 257/411
See application file for complete search history.

(56) References Cited

U.S. PATENT DOCUMENTS

| | | | |
|---|---|---|---|
| 7,507,629 B2 | 3/2009 | Lucovsky et al. | |
| 7,531,399 B2 | 5/2009 | Yen et al. | |
| 7,799,637 B2 | 9/2010 | Mokhlesi | |
| 7,981,808 B2 | 7/2011 | Luo et al. | |
| 8,105,959 B2 | 1/2012 | Ohashi | |
| 8,148,262 B2 | 4/2012 | Akiyama et al. | |
| 2007/0207624 A1* | 9/2007 | Chua | 438/758 |
| 2008/0023732 A1 | 1/2008 | Felch et al. | |
| 2010/0081290 A1* | 4/2010 | Luo et al. | 438/761 |
| 2011/0001179 A1* | 1/2011 | Yanagi et al. | 257/316 |
| 2011/0003445 A1* | 1/2011 | Murata et al. | 438/231 |
| 2011/0169141 A1 | 7/2011 | Shepard, Jr. et al. | |
| 2012/0007145 A1* | 1/2012 | Chen et al. | 257/192 |
| 2014/0120738 A1* | 5/2014 | Jung et al. | 438/778 |

* cited by examiner

*Primary Examiner* — Olik Chaudhuri
*Assistant Examiner* — Christine Enad
(74) *Attorney, Agent, or Firm* — Scully, Scott, Murphy & Presser, P.C.; Catherine Ivers, Esq.

(57) ABSTRACT

A gate dielectric can be formed by depositing a first silicon oxide material by a first atomic layer deposition process. The thickness of the first silicon oxide material is selected to correspond to at least 10 deposition cycles of the first atomic layer deposition process. The first silicon oxide material is converted into a first silicon oxynitride material by a first plasma nitridation process. A second silicon oxide material is subsequently deposited by a second atomic layer deposition process. The second silicon oxide material is converted into a second silicon oxynitride material by a second plasma nitridation process. Multiple repetitions of the atomic layer deposition process and the plasma nitridation process provides a silicon oxynitride material having a ratio of nitrogen atoms to oxygen atoms greater than 1/3, which can be advantageously employed to reduce the leakage current through a gate dielectric.

17 Claims, 6 Drawing Sheets

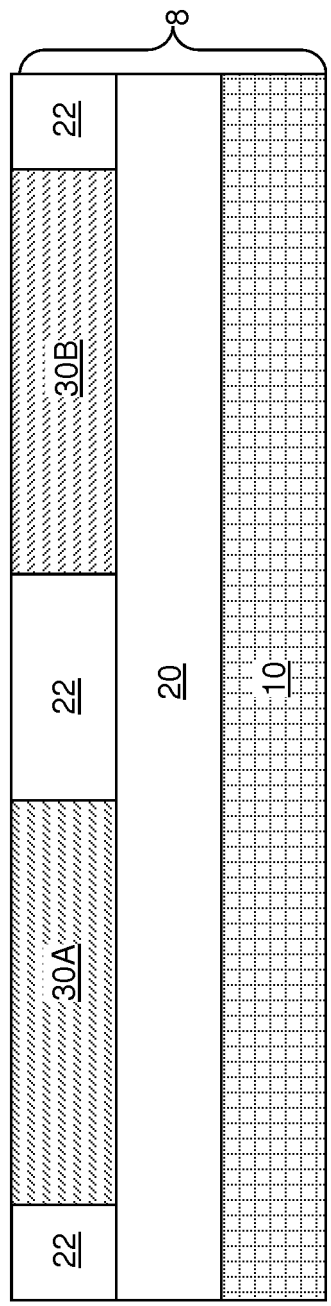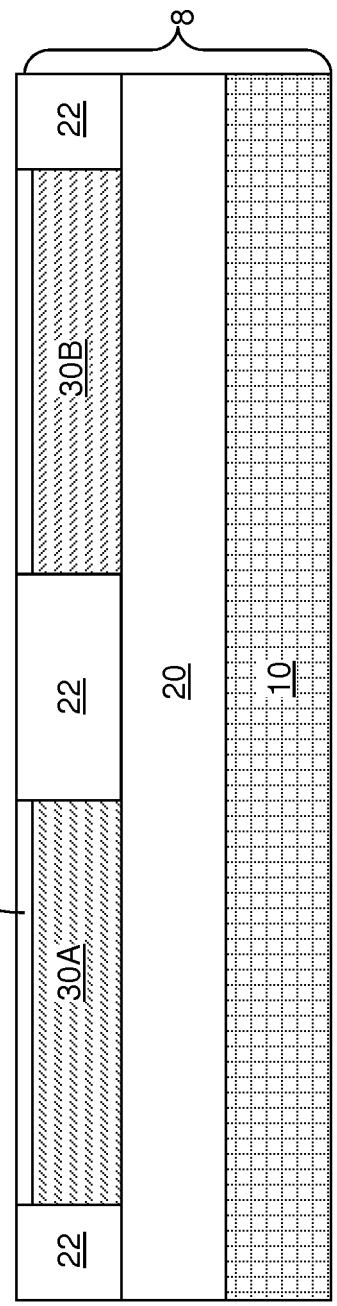

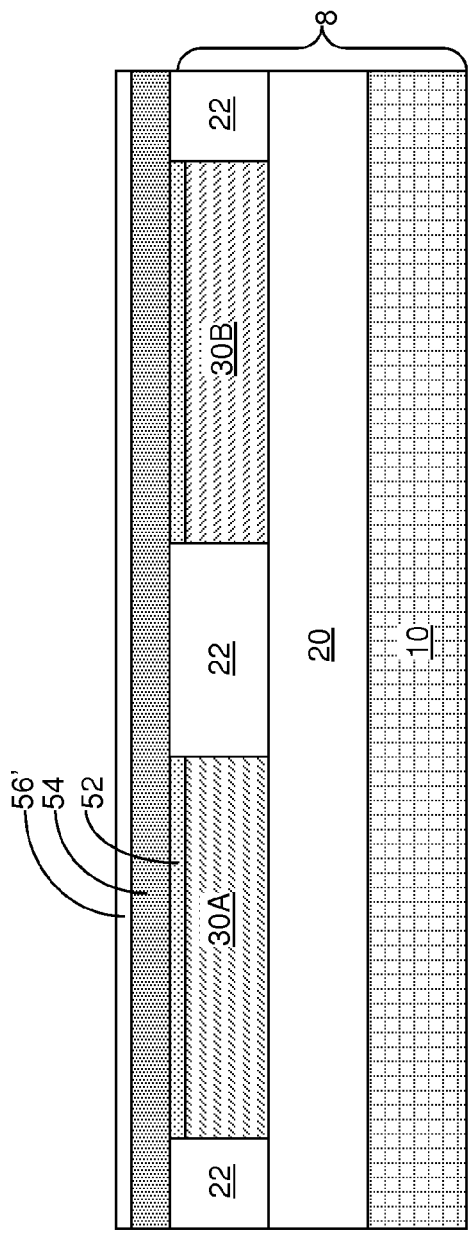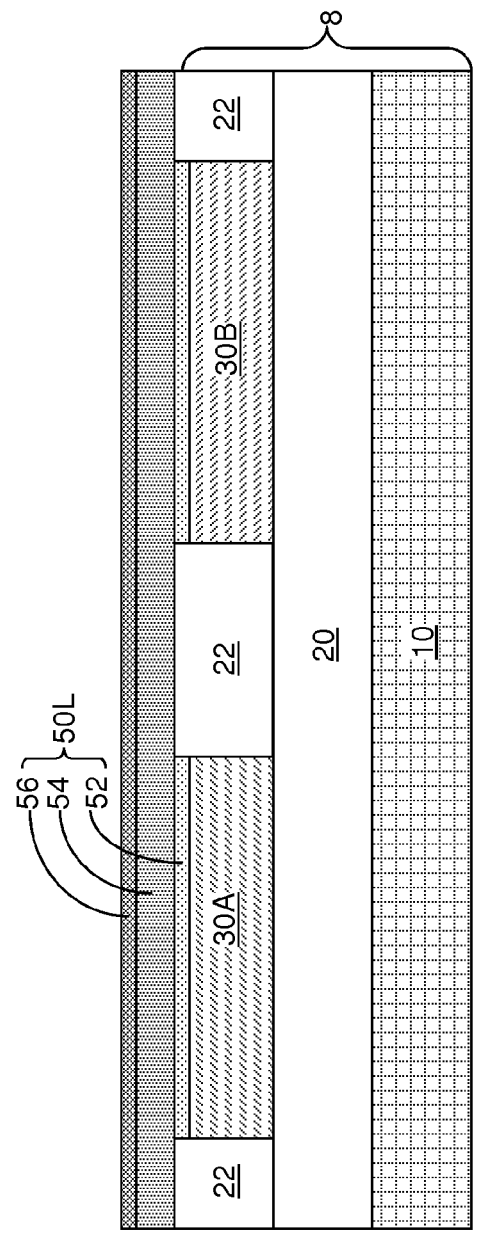

MULTI-PLASMA NITRIDATION PROCESS FOR A GATE DIELECTRIC

BACKGROUND

The present disclosure relates to a semiconductor manufacturing process, and particularly to a method of forming a gate dielectric through a multi-plasma nitridation process in combination with silicon oxide deposition by atomic layer deposition.

Gate oxide reliability is one of major reliability issues that advanced semiconductor manufacturing technology faces. The gate oxide of a field effect transistor needs to be as thin as possible while avoiding dielectric breakdown caused by leakage currents. An equivalent gate oxide thickness calculated by capacitance measurements tracks with an equivalent gate oxide thickness calculated by measurements on leakage currents, with the offset being substantially independent of most processing parameters employed to form the gate dielectric. A method of reducing the equivalent gate oxide thickness calculated by measurements on leakage currents without reducing the equivalent gate oxide thickness calculated by capacitance measurements is desired.

BRIEF SUMMARY

A gate dielectric can be formed by depositing a first silicon oxide material by a first atomic layer deposition process. The thickness of the first silicon oxide material is selected to correspond to at least 10 deposition cycles of the first atomic layer deposition process. The first silicon oxide material is converted into a first silicon oxynitride material by a first plasma nitridation process. A second silicon oxide material is subsequently deposited by a second atomic layer deposition process. The second silicon oxide material is converted into a second silicon oxynitride material by a second plasma nitridation process. Multiple repetitions of the atomic layer deposition process and the plasma nitridation process provides a silicon oxynitride material having a ratio of nitrogen atoms to oxygen atoms greater than 1/3, which can be advantageously employed to reduce the leakage current through a gate dielectric.

According to an aspect of the present disclosure, a method of forming a semiconductor structure is provided. A first silicon oxide material is deposited on a semiconductor substrate by a first atomic layer deposition process. The first silicon oxide material is converted into a first silicon oxynitride material by a first plasma nitridation process. A second silicon oxide material is deposited on the first silicon oxynitride material by a second atomic layer deposition process. The second silicon oxide material is converted into a second silicon oxynitride material by a second plasma nitridation process. A ratio of nitrogen atoms to oxygen atoms in a stack of the first and second silicon oxynitride materials is greater than 1/3.

According to another aspect of the present disclosure, a method of forming a semiconductor structure is provided. A first gate dielectric and a second gate dielectric are formed over a first channel region and over a second channel region, respectively, in a semiconductor substrate. The first channel region and the second channel region have different compositions, and the first and second gate dielectrics have a substantially same thickness over the first channel region and the second channel region.

According to yet another aspect of the present disclosure, a semiconductor structure includes a first channel region location in a semiconductor substrate, a second channel region located in the semiconductor substrate, a first gate dielectric located over the first channel region, and a second gate dielectric located over the second channel region. The first and second channel regions have different compositions. The first and second gate dielectrics have substantially same thickness. In one embodiment, the first channel region includes silicon, and the second channel region includes a silicon-germanium alloy including germanium at an atomic concentration greater than about 20%, and a difference between thicknesses of the second gate dielectric and the first gate dielectric is less than, or equal to, about 0.3 nm.

According to still another aspect of the present disclosure, a semiconductor structure is provided, which includes a first gate dielectric and a second gate dielectric. The first gate dielectric is located on a silicon portion in a semiconductor substrate and includes a first vertical stack, from bottom to top, of a silicon oxynitride layer including nitrogen at an atomic concentration in a range from 2% to 10% and a first silicon oxynitride material portion having a nitrogen-to-oxygen atomic ratio greater than 1/3. The second gate dielectric is located on a silicon-germanium alloy portion in the semiconductor substrate and includes a second vertical stack, from bottom to top, of a silicon-germanium oxynitride layer including nitrogen at an atomic concentration in a range from 2% to 10% and a second silicon oxynitride material portion having a same nitrogen-to-oxygen atomic ratio as the first silicon oxynitride material portion. In one embodiment, the silicon-germanium alloy portion includes germanium at an atomic concentration greater than 20%, and a difference between a thickness of the second vertical stack and the first vertical stack is not greater than 0.3 nm.

BRIEF DESCRIPTION OF THE SEVERAL VIEWS OF THE DRAWINGS

FIG. 1 is a vertical cross-sectional view of an exemplary semiconductor structure after formation of shallow trench isolation structures according to an embodiment of the present disclosure.

FIG. 2 is a vertical cross-sectional view of the exemplary semiconductor structure after formation of silicon-containing oxynitride material portions according to an embodiment of the present disclosure.

FIG. 5 is a vertical cross-sectional view of the exemplary semiconductor structure after deposition of a second silicon oxide material according to an embodiment of the present disclosure.

FIG. 6 is a vertical cross-sectional view of the exemplary semiconductor structure after conversion of the second silicon oxide material into a second silicon oxynitride material according to an embodiment of the present disclosure.

DETAILED DESCRIPTION

Figure 3:
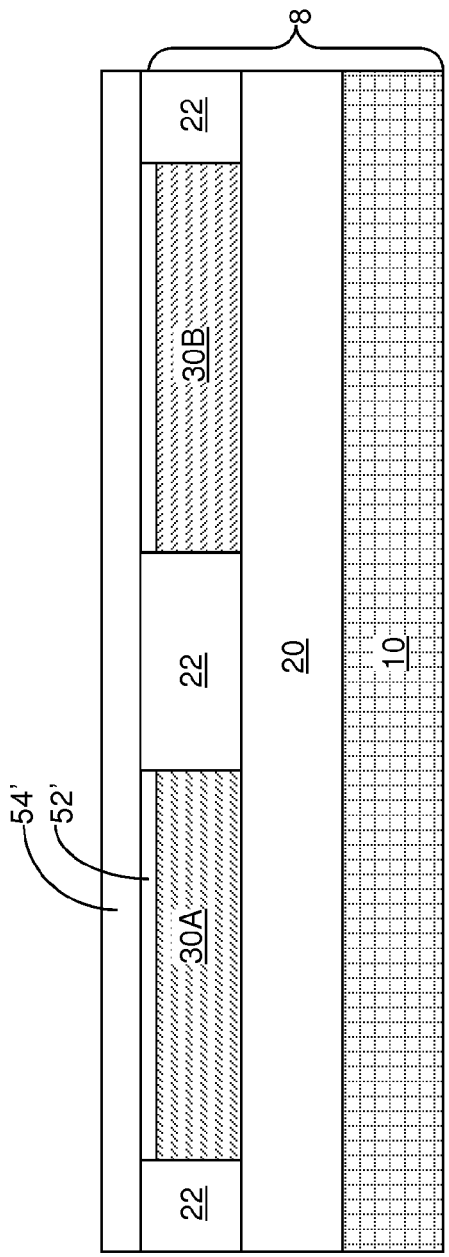
FIG. 3 is vertical cross-sectional view of the exemplary semiconductor structure after deposition of a first silicon oxide material according to an embodiment of the present disclosure.

As stated above, the present disclosure relates to a method of forming a gate dielectric through a multi-plasma nitridation process in combination with silicon oxide deposition by atomic layer deposition. Aspects of the present disclosure are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a substrate 8, which is a semiconductor substrate, i.e., a substrate that includes a semiconductor material. The substrate 8 can be a semiconductor-on-insulator (SOI) substrate, a bulk semiconductor substrate, or a hybrid substrate including a bulk portion and an SOI portion. In one embodiment, the substrate 8 can be an SOI substrate including a handle substrate 10, a buried insulator layer 20, and a top semiconductor layer.

Shallow trench isolation structures 22 can be formed in the top semiconductor layer employing methods known in the art. In this case, the remaining portions of the top semiconductor layer can be divided into multiple top semiconductor portions that are laterally spaced by the shallow trench isolation structures. For example, the multiple top semiconductor portions can include a first top semiconductor portion 30A and a second top semiconductor portion 30B.

The first top semiconductor portion 30A and the second top semiconductor portion 30B can include the same semiconductor material, or can include different semiconductor materials. The semiconductor materials that can be employed for the multiple top semiconductor portions (30A, 30B) include, but are not limited to, silicon, a silicon-germanium alloy, a silicon-carbon alloy, a silicon-germanium-carbon alloy, compound semiconductor materials, and combinations and/or layered stacks of the foregoing. In an illustrative example, the first top semiconductor portion 30A can include single crystalline silicon, and the second top semiconductor portion 30B can include a single crystalline material including a silicon-germanium alloy, a silicon-carbon alloy, or a silicon-germanium-carbon alloy. The top semiconductor portions (30A, 30B) can be single crystalline, polycrystalline, or amorphous. In one embodiment, the top semiconductor portions (30A, 30B) can be single crystalline.

While description of the present disclosure employs an embodiment in which the substrate 8 is an SOI substrate, embodiments in which the substrate is a bulk substrate or a hybrid substrate are expressly contemplated herein.

Referring to FIG. 2, silicon-containing oxynitride material portions 52' can be formed by conversion of surface regions of the top semiconductor portions (30A, 30B) if the top semiconductor portions (30A, 30B) include at least one silicon-containing material. The silicon containing material can be, for example, silicon, a silicon-germanium alloy, a silicon-carbon alloy, or a silicon-germanium-carbon alloy. The top semiconductor portions (30A, 30B) can be silicon-containing material portions, and the conversion of the surface regions of the top semiconductor portions (30A, 30B) can be performed by an anneal in an environment including an oxygen-and-nitrogen-containing gas and/or a combination of a nitrogen-containing gas and an oxygen-containing gas at an elevated temperature in a range from 700 degrees Celsius to 1,100 degrees Celsius. The oxygen-and-nitrogen-containing gas is an inorganic gas that includes at least one oxygen atom and at least one nitrogen atom per molecule, and can be, for example, $N_2O$, NO, or $NO_2$. The oxygen-containing gas and the nitrogen-containing gas may be the same (i.e., can be a gas including oxygen and nitrogen such as $N_2O$, NO, or $NO_2$), or can be two distinct gas species. In one embodiment, the nitrogen-containing gas can be $N_2$, $N_2O$, NO, or $NO_2$ and the oxygen-containing gas can be $O_2$, $H_2O$, NO, or $NO_2$. An inert carrier gas such as Ar may be optionally employed during the anneal.

The anneal oxynitridates, i.e., simultaneously oxidizes and nitridates, the surface regions of the top semiconductor portions (30A, 30B), and forms silicon-containing oxynitride material portions 52'. Each silicon-containing oxynitride material portion 52' can be, for example, a thermal silicon oxynitride portion or a thermal silicon-germanium-oxynitride portion. The thickness of each silicon-containing oxynitride material portion 52' can be from 0.7 nm to 1.2 nm, although lesser and greater thicknesses can also be employed. In one embodiment, at least one of the silicon-containing oxynitride material portions 52' can consist essentially of thermal silicon oxynitride, and at least another of the silicon-containing oxynitride material portions 52' can consist essentially of thermal silicon-germanium oxynitride.

The oxynitridation of the surface regions of the top semiconductor portions (30A, 30B) incorporates nitrogen atoms into the silicon-containing oxynitride material portions 52' at an atomic concentration in a range from 2% to 10%. The presence of nitrogen atoms in the silicon-containing oxynitride material portions 52' has an advantageous effect of reducing the difference among the conversion rates of silicon-germanium alloy materials having different atomic concentrations of germanium in a range greater than 0% and less than 100%, and between silicon and any silicon-germanium alloy material having an atomic concentration of germanium in a range greater than 0% and less than 100%.

In one embodiment, the first top semiconductor portion 30A can be a silicon portion and the second top semiconductor portion 30B can be a silicon-germanium alloy portion. A surface region of the silicon portion can be converted into a silicon oxynitride layer, and a surface region of the silicon-germanium alloy portion can be converted into a silicon-germanium oxynitride layer simultaneously with the conversion of the surface region of the silicon portion. The simultaneously conversion of the surface region of the silicon portion and the surface region of the silicon-germanium alloy portion can be performed by a thermal oxynitridation process employing an oxygen-and-nitrogen-containing gas or a combination of an oxygen-containing gas and a nitrogen-containing gas. In one embodiment, the silicon-germanium alloy portion can include germanium at an atomic concentration greater than 20%. In one embodiment, the silicon-germanium alloy portion can include germanium at an atomic concentration in a range from 20% to 30%.

For example, if a thermal oxidation process that forms more than 0.5 nm of silicon oxide on a single crystalline silicon surface is employed to form a silicon-germanium oxide from a single crystalline silicon-germanium alloy having an atomic concentration of germanium greater than 20%, the thickness of the silicon-germanium oxide is greater than the thickness of the silicon oxide by at least 0.5 nm. The thickness differential increases with the atomic concentration of germanium. In contrast, the oxynitridation process of the present disclosure can be employed to simultaneously form a silicon oxynitride having a first thickness on a single crystalline silicon material and a silicon-germanium oxynitride having a second thickness on a single crystalline silicon-germanium alloy material having an atomic concentration not less than 20% and not greater than 30% such that the difference between the second thickness and the first thickness does not exceed 0.3 nm.

Thus, if the first top semiconductor portion 30A includes single crystalline silicon, and if the second top semiconductor portion 30B includes a single crystalline silicon-germanium alloy in which the atomic concentration of germanium in a range from 20% and 30%, the thickness differential between the silicon-germanium oxynitride in the silicon-containing oxynitride material portion 52' on the second top semiconductor portion 30B and the silicon oxynitride in the silicon-containing oxynitride material portion 52' in the first top semiconductor portion 30A can be in a range from 0 nm to 0.3 nm when the thickness of the silicon oxynitride in the silicon-containing oxynitride material portion 52' is in a range from 0.7 nm to 1.2 nm.

Referring to FIG. 3, a first silicon oxide material layer 54' is formed on the top surface of the silicon-containing oxynitride material portions 52' by deposition of a first silicon oxide material. The deposition of the first silicon oxide material can be effected, for example, by a first atomic layer deposition (ALD) process. During the first ALD process, the exemplary semiconductor structure is placed within a process chamber compatible with maintenance of an ultrahigh vacuum environment. As used herein, an ultrahigh vacuum environment refers to an environment having a base pressure of less than $1.0 \times 10^{-6}$ Torr. In one embodiment, the base pressure of the process chamber can be less than $1.0 \times 10^{-7}$ Torr. In another embodiment, the base pressure of the process chamber can be less than $1.0 \times 10^{-8}$ Torr. In yet another embodiment, the base pressure of the process chamber can be less than $1.0 \times 10^{-9}$ Torr.

Upon loading of the exemplary semiconductor structure in the process chamber, the process chamber is pumped down to the base pressure. Subsequently, at least 10 deposition cycles are performed to deposit the first silicon oxide material on the surfaces of the silicon-containing oxynitride material portions 52' and on physically exposed surfaces of the shallow trench isolation structures 22. Each deposition cycle includes a silicon-containing precursor exposure phase in which the process chamber containing the exemplary semiconductor substrate includes a silicon-containing precursor gas at a first pressure, and an oxygen exposure phase in which the process chamber includes an oxygen-containing gas at a second pressure.

Each pair of a silicon-containing precursor exposure phase and an oxygen exposure phase is temporally spaced by an intra-cycle pump down phase, during which the process chamber is pumped down to the base pressure. Each deposition cycle is temporally spaced from a preceding deposition cycle or from a subsequent deposition cycle by an inter-cycle pump down phase, during which the process chamber is pumped down to the base pressure. Thus, the process chamber is void of, i.e., does not include, any oxygen-containing gas during the silicon-containing precursor phase, and is void of any silicon-containing gas during the oxygen exposure phase.

The silicon-containing precursor gas is a gas that includes at least one silicon atom per molecule. In one embodiment, each molecule of the silicon-containing precursor gas can include at least one silicon atom and at least one hydrogen atom. In one embodiment, the silicon-containing precursor gas can be selected from, for example, $SiH_4$, $SiH_2Cl_2$, $SiHCl_3$, and $Si_2H_6$. The oxygen-containing gas is a gas that includes at least one oxygen atom per molecule, and can be selected from, for example, $O_2$, $O_3$, and a combination of $O_2$ and $O_3$.

The duration of each silicon-containing precursor exposure phase can be from 1 second to 60 seconds, although lesser and greater durations can also be employed. The duration of each oxygen exposure phase can be from 1 second to 60 seconds, although lesser and greater durations can also be employed.

The partial pressure of the silicon-containing precursor gas during each silicon-containing precursor exposure phase can be in a range from $1.0 \times 10^{-5}$ Torr to $1.0 \times 10^{-2}$ Torr, although lesser and greater partial pressures can also be employed. The partial pressure of the oxygen-containing gas during each oxygen exposure phase can be in a range from $1.0 \times 10^{-5}$ Torr to $1.0 \times 10^{-2}$ Torr, although lesser and greater partial pressures can also be employed.

The temperature of the exemplary semiconductor structure during the first ALD process can be in a range from 200 degrees Celsius to 600 degrees Celsius, although lesser and greater temperatures can also be employed. In one embodiment, the temperature of the exemplary semiconductor structure during the first ALD process can be in a range from 300 degrees Celsius to 450 degrees Celsius.

Each deposition cycle deposits a monolayer of silicon oxide material, which has a thickness of about 0.15 nm. The thickness of the first silicon oxide material layer 54' is linearly proportional to the number of deposition cycles in the first ALD process. In one embodiment, the first atomic layer deposition process employs a number of deposition cycles selected from a range from 12 to 20, which corresponds to a thickness range from 1.8 nm to 3.0 nm. In another embodiment, the first atomic layer deposition process employs a number of deposition cycles selected from a range from 13 to 17, which corresponds to a thickness range from 1.95 nm to 2.55 nm.

The thickness of the first silicon oxide material layer 54' is selected to be greater than a minimum thickness in order to avoid formation of silicon nitride at the interface between the top semiconductor portions (30A, 30B) and the silicon-containing oxynitride material portions 52' during a plasma nitridation process to be subsequently performed. The minimum thickness of the first silicon oxide material layer 54' depends on the thickness of the silicon-containing oxynitride material portions 52' and the intensity and duration of the nitrogen plasma to be employed in the subsequent plasma nitridation process. It is known that formation of a semiconductor nitride on a surface of a semiconductor portion induces pinning of charge carriers, and degrades the performance of the semiconductor portion as a channel of a field effect transistor.

In general, a total thickness of about 2.7 nm is needed for the combination of the silicon-containing oxynitride material portions 52' and the first silicon oxide material layer 54' in order to avoid formation of silicon nitride or a silicon-germanium nitride at the interface between the top semiconductor portions (30A, 30B) and the silicon-containing oxynitride material portions 52' during the subsequent plasma nitridation process. Because a thickness of about 0.9 nm is necessary to ensure formation of a contiguous silicon oxide layer during formation of the silicon-containing oxynitride material portions 52', the first silicon oxide material layer 54' needs to have a thickness of at least 1.8 nm, which corresponds to 12 deposition cycles.

Figure 4:
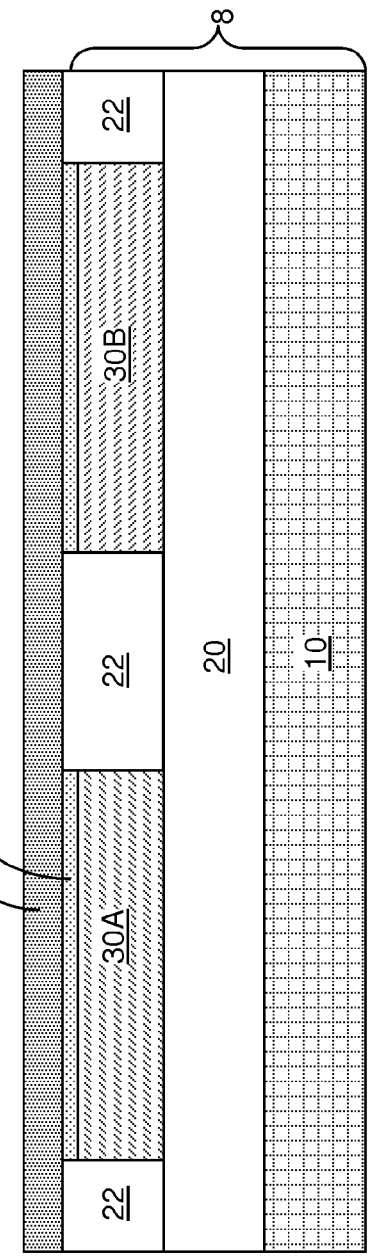
FIG. 4 is a vertical cross-sectional view of the exemplary semiconductor structure after conversion of the first silicon oxide material into a first silicon oxynitride material according to an embodiment of the present disclosure.

Referring to FIG. 4, the exemplary semiconductor structure is removed from the process chamber for the first ALD process, and is placed in a process chamber configured for a plasma nitridation process, which is herein referred to as a plasma nitridation chamber. A first plasma nitridation process is performed to introduce nitrogen atoms in the stack of the first silicon oxide material layer 54' and the silicon-containing oxynitride material portions 52'. The first plasma nitridation process converts the first silicon oxide material of the first silicon oxide material layer 54' into a first silicon oxynitride material layer 54 containing a silicon oxynitride material, and converts the silicon-containing oxide material(s) of the silicon-containing oxynitride material portions 52' into silicon-containing oxynitride material portions 52 containing silicon-containing oxynitride material(s).

The first plasma nitridation process employs a plasma of a nitrogen-containing gas. The nitrogen-containing gas is a gas including at least one nitrogen atom per molecule. In one embodiment, the nitrogen-containing gas can be selected from $N_2$, $NH_3$, $NO$, $N_2O$, $NO_2$, and combinations thereof. In one embodiment, the first plasma nitridation process can employ a plasma generation chamber coupled to the process chamber in which the semiconductor substrate is placed through a plasma conduit. The configuration in which the plasma generation chamber and the process chamber are connected through the plasma conduit is referred to as a "decoupled plasma" configuration. The nitrogen plasma is generated in the plasma generation chamber, flows through the plasma conduit into the process chamber, and nitridates the first silicon oxide material layer 54' and the silicon-containing oxynitride material portions 52' to form the first silicon oxynitride material layer 54 and the silicon-containing oxynitride material portions 52, respectively.

The first silicon oxide material layer 54' is directly exposed to the plasma of the nitrogen-containing gas, and the silicon-containing oxynitride material portions 52' are not directly exposed to the plasma of the nitrogen-containing gas. Nitrogen atoms that are incorporated into the silicon-containing oxynitride material portions 52 pass through the first silicon oxide material layer 54'. Thus, the average concentration of nitrogen in the silicon-containing oxynitride material portions 52 is lesser than the average concentration of the first silicon oxynitride material layer 54. The thickness of the silicon-containing oxynitride material portions 52' and the thickness of the first silicon oxide material layer 54' can be selected to avoid formation of a semiconductor nitride at the interface between the top semiconductor portions (30A, 30B) and the silicon-containing oxynitride material portions 52 as discussed above.

In a non-limiting illustrative example, the substrate 8 can be a 300 mm semiconductor substrate as known in the art. In this case, the first plasma nitridation process can be performed employing a radio frequency (RF) power for plasma generation in a range from 1 kW to 3 kW, a duty cycle in a range from 20% to 50%, plasma pressure in a range from 1 mTorr to 30 mTorr, temperature in a range from 10 degrees Celsius to 600 degrees Celsius, and a plasma duration in a range from 1 minute to 20 minutes.

Optionally, the semiconductor substrate with the silicon-containing oxynitride material portions 52 and the first silicon oxynitride material layer 54 thereupon can be placed in a nitridation environment after the first plasma nitridation process. The nitridation environment can include a nitrogen-containing gas at an elevated temperature in a range from 600 degrees Celsius to 900 degrees Celsius. The nitridation environment can be provided, for example, by a conventional furnace that operates at atmospheric temperature. The duration of the nitridation at the elevated temperature can be from 1 minute to 60 minutes.

In one embodiment, the ratio of nitrogen atoms to oxygen atoms in the stack of the silicon-containing oxynitride material portions 52 and the first silicon oxynitride material layer 54 can be greater than 1/3 after the processing step(s) of FIG. 4. In one embodiment, the ratio of nitrogen atoms to oxygen atoms in the stack of the silicon-containing oxynitride material portions 52 and the first silicon oxynitride material layer 54 can be in a range from 1/3 to 0.70. In another embodiment, the ratio of nitrogen atoms to oxygen atoms can be in a range from 0.45 to 0.70. In yet another embodiment, the ratio of nitrogen atoms to oxygen atoms can be in a range from 0.50 to 0.65.

In one embodiment, the stack of the silicon-containing oxynitride material portions 52 and the first silicon oxynitride material layer 54 can have an overall composition of $SiO_xN_y$, in which $x/2+3y/4$ is in a range from 0.75 to 1.25. In another embodiment, the stack of the silicon-containing oxynitride material portions 52 and the first silicon oxynitride material layer 54 can have an overall composition of $SiO_xN_y$, in which $x/2+3y/4$ is in a range from 0.95 to 1.05. In yet another embodiment, the stack of the silicon-containing oxynitride material portions 52 and the first silicon oxynitride material layer 54 can have an overall composition of $SiO_xN_y$, in which $x/2+3y/4$ is substantially 1.00, i.e., in a range from 0.99 to 1.01.

The atomic percentage of nitrogen in the silicon-containing oxynitride material portions 52 is lower than the average atomic percentage of nitrogen in the stack of the silicon-containing oxynitride material portions 52 and the first silicon oxynitride material layer 54. In one embodiment, the ratio of nitrogen atoms to oxygen atoms in the silicon-containing oxynitride material portions 52 is less than the average ratio of nitrogen atoms to oxygen atoms in the stack of the silicon-containing oxynitride material portions 52 and the first silicon oxynitride material layer 54. The ratio of nitrogen atoms to oxygen atoms in the silicon-containing oxynitride material portions 52 can be less than, equal to, or greater than, 1/3. In one embodiment, the ratio of nitrogen atoms to oxygen atoms in the silicon-containing oxynitride material portions 52 can be in a range from 0.1 to 0.50. In another embodiment, the ratio of nitrogen atoms to oxygen atoms can be in a range from 0.15 to 1/3. In yet another embodiment, the ratio of nitrogen atoms to oxygen atoms can be in a range from 1/3 to 0.50.

In one embodiment, the silicon-containing oxynitride material portions 52 can have an overall composition of $SiO_xN_y$, in which $x/2+3y/4$ is in a range from 0.75 to 1.25. In another embodiment, the silicon-containing oxynitride material portions 52 can have an overall composition of $SiO_xN_y$, in which $x/2+3y/4$ is in a range from 0.95 to 1.05. In yet another embodiment, the silicon-containing oxynitride material portions 52 can have an overall composition of $SiO_xN_y$, in which $x/2+3y/4$ is substantially 1.00, i.e., in a range from 0.99 to 1.01.

Referring to FIG. 5, a second silicon oxide material layer 56' is formed on the top surface of the first silicon oxynitride material layers 54 by deposition of a second silicon oxide material. The deposition of the second silicon oxide material can be effected, for example, by a second atomic layer deposition (ALD) process. During the second ALD process, the exemplary semiconductor structure is placed within a process chamber compatible with maintenance of an ultrahigh vacuum environment. In one embodiment, the same process chamber can be employed for the second ALD process as for the first ALD process.

Upon loading of the exemplary semiconductor structure in the process chamber, the process chamber is pumped down to the base pressure. Subsequently, a plurality of deposition cycles is performed to deposit the second silicon oxide material on the surfaces of the first silicon oxynitride material layers 54. Each deposition cycle includes a silicon-containing precursor exposure phase in which the process chamber containing the exemplary semiconductor substrate includes a silicon-containing precursor gas at a second pressure, and an oxygen exposure phase in which the process chamber includes an oxygen-containing gas at a second pressure.

Each pair of a silicon-containing precursor exposure phase and an oxygen exposure phase is temporally spaced by an intra-cycle pump down phase, during which the process chamber is pumped down to the base pressure. Each deposition cycle is temporally spaced from a preceding deposition cycle or from a subsequent deposition cycle by an inter-cycle pump down phase, during which the process chamber is pumped down to the base pressure. Thus, the process chamber is void of any oxygen-containing gas during the silicon-containing precursor phase, and is void of any silicon-containing gas during the oxygen exposure phase.

The silicon-containing precursor gas can be the same as in the first ALD process. The oxygen-containing gas can be the same as in the first ALD process. Processing parameters of the silicon-containing precursor exposure phase and the oxygen exposure phase can be within the same range as in the first ALD process.

Each deposition cycle deposits a monolayer of silicon oxide material. The thickness of the second silicon oxide material layer 56' is linearly proportional to the number of deposition cycles in the second ALD process. In one embodiment, the second ALD process can include at least 4 deposition cycles. In one embodiment, the second ALD process can employ a number of deposition cycles selected from a range from 4 to 20, which corresponds to a thickness range from 0.6 nm to 3.0 nm. In another embodiment, the second atomic layer deposition process employs a number of deposition cycles selected from a range from 4 to 6, which corresponds to a thickness range from 0.6 nm to 0.9 nm.

Referring to FIG. 6, the exemplary semiconductor structure is removed from the process chamber for the second ALD process, and is placed in a plasma nitridation chamber. A second plasma nitridation process is performed to introduce nitrogen atoms into the second silicon oxide material layer 56'. The second plasma nitridation process converts the second silicon oxide material of the second silicon oxide material layer 56' into a second silicon oxynitride material layer 56 containing a silicon oxynitride material.

The second plasma nitridation process employs a plasma of a nitrogen-containing gas. Any of the nitrogen-containing gas that can be employed for the first plasma nitridation process can be employed for the second plasma nitridation process. In one embodiment, the second plasma nitridation process can employ a combination of a plasma generation chamber and a process chamber in a decoupled plasma configuration. The nitrogen plasma is generated in the plasma generation chamber, flows through the plasma conduit into the process chamber, and nitridates the second silicon oxide material layer 56' to form the second silicon oxynitride material layer 56.

The second silicon oxide material layer 56' is directly exposed to the plasma of the nitrogen-containing gas. The intensity and the duration of the nitridation plasma can be selected to achieve a target concentration of nitrogen in the second silicon oxynitride material layer 56, and depends on the thickness of the second silicon oxide material layer 56' to be nitridated.

In a non-limiting illustrative example, the substrate 8 can be a 300 mm semiconductor substrate as known in the art. In this case, the second plasma nitridation process can be performed employing a radio frequency (RF) power for plasma generation in a range from 0.7 kW to 2 kW, a duty cycle in a range from 20% to 50%, plasma pressure in a range from 1 mTorr to 30 mTorr, temperature in a range from 10 degrees Celsius to 600 degrees Celsius, and a plasma duration in a range from 20 seconds to 10 minutes.

In one embodiment, the ratio of nitrogen atoms to oxygen atoms in the stack of the silicon-containing oxynitride material portions 52, the first silicon oxynitride material layer 54, and the second silicon oxynitride material layer 56 can be greater than 1/3. In one embodiment, the ratio of nitrogen atoms to oxygen atoms in the stack of the silicon-containing oxynitride material portions 52, the first silicon oxynitride material layer 54, and the second silicon oxynitride material layer 56 can be in a range from 1/3 to 0.70. In another embodiment, the ratio of nitrogen atoms to oxygen atoms can be in a range from 0.45 to 0.70. In yet another embodiment, the ratio of nitrogen atoms to oxygen atoms can be in a range from 0.50 to 0.65.

In one embodiment, the stack of the silicon-containing oxynitride material portions 52, the first silicon oxynitride material layer 54, and the second silicon oxynitride material layer 56 can have an overall composition of $SiO_xN_y$, in which $x/2+3y/4$ is in a range from 0.75 to 1.25. In another embodiment, the stack of the silicon-containing oxynitride material portions 52, the first silicon oxynitride material layer 54, and the second silicon oxynitride material layer 56 can have an overall composition of $SiO_xN_y$, in which $x/2+3y/4$ is in a range from 0.95 to 1.05. In yet another embodiment, the stack of the silicon-containing oxynitride material portions 52, the first silicon oxynitride material layer 54, and the second silicon oxynitride material layer 56 can have an overall composition of $SiO_xN_y$, in which $x/2+3y/4$ is substantially 1.00, i.e., in a range from 0.99 to 1.01.

The atomic percentage of nitrogen in the silicon-containing oxynitride material portions 52 is lower than the average atomic percentage of nitrogen in the stack of the silicon-containing oxynitride material portions 52, the first silicon oxynitride material layer 54, and the second silicon oxynitride material layer 56. In one embodiment, the ratio of nitrogen atoms to oxygen atoms in the silicon-containing oxynitride material portions 52 is less than average ratio of nitrogen atoms to oxygen atoms in the stack of the silicon-containing oxynitride material portions 52, the first silicon oxynitride material layer 54, and the second silicon oxynitride material layer 56. The ratio of nitrogen atoms to oxygen atoms in the silicon-containing oxynitride material portions 52 can be less than, equal to, or greater than, 1/3. In one embodiment, the ratio of nitrogen atoms to oxygen atoms in the silicon-containing oxynitride material portions 52 can be in a range from 0.1 to 0.50. In another embodiment, the ratio of nitrogen atoms to oxygen atoms can be in a range from 0.15 to 1/3. In yet another embodiment, the ratio of nitrogen atoms to oxygen atoms can be in a range from 1/3 to 0.50.

In one embodiment, the silicon-containing oxynitride material portions 52 can have an overall composition of $SiO_xN_y$, in which $x/2+3y/4$ is in a range from 0.75 to 1.25. In another embodiment, the silicon-containing oxynitride material portions 52 can have an overall composition of $SiO_xN_y$, in which $x/2+3y/4$ is in a range from 0.95 to 1.05. In yet another embodiment, the silicon-containing oxynitride material portions 52 can have an overall composition of $SiO_xN_y$, in which $x/2+3y/4$ is substantially 1.00, i.e., in a range from 0.99 to 1.01.

The silicon-containing oxynitride material portions 52, the first silicon oxynitride material layer 54, and the second silicon oxynitride material layer 56 collectively constitute a gate dielectric layer 50L.

Figure 7:
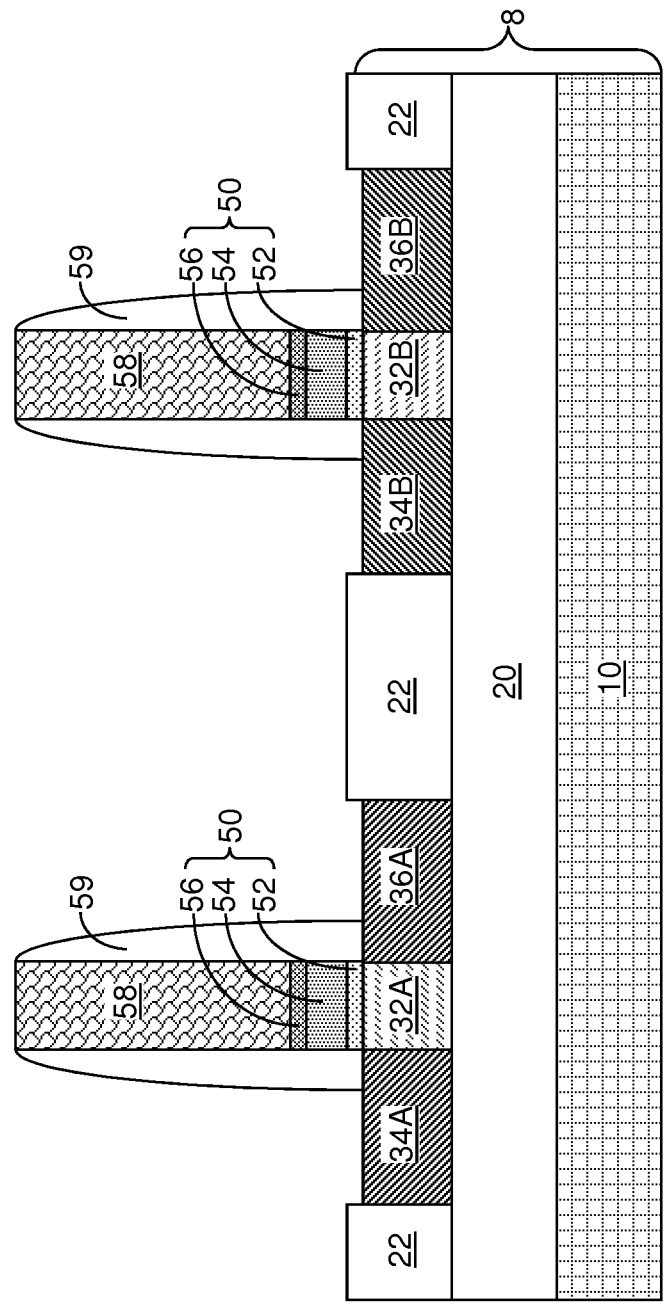
FIG. 7 is a vertical cross-sectional view of the exemplary semiconductor structure after formation of field effect transistors according to an embodiment of the present disclosure.

Referring to FIG. 7, field effect transistors can be formed on the substrate 8 by forming gate stacks (50, 58), gate spacers 59, and source and drain regions. For example, a gate conductor layer can be deposited over the gate dielectric layer 50. The gate conductor layer includes at least one conductive material, which can be at least one metallic material, at least one doped semiconductor material, or a combination thereof. The gate conductor layer and the gate dielectric layer 50L can be patterned by a combination of lithographic patterning of an applied photoresist layer and transfer of the pattern in the photoresist layer into the gate conductor layer and the gate dielectric layer 50L by at least one anisotropic etch that employs the photoresist layer as an etch mask. The remaining portions of the gate dielectric layer 50L constitute gate dielectrics 50, and remaining portions of the gate conductor layer constitutes gate electrodes 58. The gate spacers 59 can be formed, for example, by deposition of a conformal dielectric material layer and by a subsequent anisotropic etch that removes horizontal portions of the conformal dielectric material layer. The remaining vertical portions of the conformal dielectric material layer constitute the gate spacers 58. The source and drain regions can be formed, for example, by implanting electrical dopants (which can be p-type dopants or n-type dopants) into regions of the top semiconductor portions (30A, 30B) employing the gate stacks (50, 58) and the gate spacers 59 as an implantation mask. The implanted regions of the first top semiconductor portion 30A can become a first source region 34A and a first drain region 36A, and the unimplanted region of the first top semiconductor portion 30A can become a first body region 32A. The implanted regions of the second top semiconductor portion 30B can become a second source region 34B and a second drain region 36B, and the unimplanted region of the second top semiconductor portion 30B can become a second body region 32B. Other methods for forming field effect transistors as known in the art may also be employed.

In one embodiment, the first body region 32A can be a silicon portion and the second body region 32B can be a silicon-germanium alloy portion. The silicon-containing oxynitride material portions 52 on the first body region 32A can be a silicon oxynitride layer, and the silicon-containing oxynitride material portions 52 on the second body region 32B can be a silicon-germanium oxynitride layer. In one embodiment, the first body region 32A can consist essentially of silicon and optional electrical dopants (p-type dopants or n-type dopants), and the second body region can consist essentially of a silicon-germanium alloy including germanium at an atomic concentration in a range from 0.1% to 99.9%. A first stack of the silicon oxynitride layer, a first portion of the first silicon oxynitride material, and a first portion of the second silicon oxynitride material can be patterned into a first gate dielectric, i.e., the gate dielectric layer 50 on the first body region 32A. A second stack of the silicon-germanium oxynitride layer, a second portion of the first silicon oxynitride material, and a second portion of the second silicon oxynitride material can be patterned into a second gate dielectric, i.e., the gate dielectric layer 50 on the second body region 32B. In this case, a thickness differential between the second gate dielectric and the first gate dielectric can be not greater than 0.3 nm. The thickness differential among various silicon-containing oxynitride material portions 52 can be under 0.3 nm for an entire range of SiGe alloy composition including an atomic concentration of germanium from 0.1% to 99.9%. Without wishing to be bound by a particular theory, it is believed that the formation of a thin initial (first) layer of silicon-containing oxynitride material in the silicon-containing oxynitride material portions 52' completely passivates any silicon-germanium alloy material underneath, and shuts down the role of germanium as a catalyst for enhancing the rate of the oxidation reaction during the subsequent oxynitride growth.

The thickness of the first silicon oxynitride material layer 54 is the same across different field effect transistors and irrespective of underlying dielectric material, i.e., irrespective of whether a silicon oxynitride is present underneath or a silicon-germanium oxynitride is present underneath. Further, the thickness of the second silicon oxynitride material layer 56 is the same across different field effect transistors and irrespective of underlying dielectric materials. Thus, if the first top semiconductor portion 30A includes single crystalline silicon, and if the second top semiconductor portion 30B includes a single crystalline silicon-germanium alloy in which the atomic concentration of germanium in a range from 20% and 30%, the thickness differential between the gate dielectric layer 50 over the second top semiconductor portion 30B and the gate dielectric layer 50 over the first top semiconductor portion 30A can be in a range from 0 nm to 0.3 nm when the thickness of the silicon oxynitride in the silicon-containing oxynitride material portion 52' is in a range from 0.7 nm to 1.2 nm.

In the first field effect transistor, a first gate dielectric (i.e., the gate dielectric layer 50 on the first body region 32A can be located on a silicon portion in a semiconductor substrate, and can include a first vertical stack, from bottom to top, of a silicon oxynitride layer (i.e., the silicon-containing oxynitride material portion 52 contacting the first body region 32A) including nitrogen at an atomic concentration in a range from 2% to 10% and a first silicon oxynitride material portion (i.e., the stack of the first silicon oxynitride material layer 54 and the second silicon oxynitride material layer 56 over the first body region 32A) having a nitrogen-to-oxygen atomic ratio greater than 1/3. A second gate dielectric (i.e., the gate dielectric layer 50 on the second body region 32B) can be located on a silicon-germanium alloy portion in the semiconductor substrate, and can include a second vertical stack, from bottom to top, of a silicon-germanium oxynitride layer (i.e., the silicon-containing oxynitride material portion 52 contacting the second body region 32B) including nitrogen at an atomic concentration in a range from 2% to 10% and a second silicon oxynitride material portion (i.e., the stack of the first silicon oxynitride material layer 54 and the second silicon oxynitride material layer 56 over the second body region 32B) having a same nitrogen-to-oxygen atomic ratio as the first silicon oxynitride material portion. If the silicon-germanium alloy portion includes germanium at an atomic concentration in a range from 0.1% to 99.9%, a difference between the thickness of the second vertical stack and the first vertical stack can be not greater than 0.3 nm.

In one embodiment, a method of forming a semiconductor structure includes forming a first gate dielectric (i.e., the gate dielectric layer 50 on the first body region 32A) and a second gate dielectric (i.e., the gate dielectric layer 50 on the second body region 32B) over a first channel region in the first body region 32A and over a second channel region in the second body region 32B, respectively, in the semiconductor substrate, which is the substrate 8. The first channel region and the second channel region have different compositions, and the first and second gate dielectrics have a substantially same thickness over the first channel region and the second channel region. As used herein, the definition of "having a substantially same thickness" means having thicknesses of which the difference does not exceed 0.3 nm. In one embodiment, the first and second gate dielectrics can have a substantially same thickness over the first channel region and the second channel region, and the thicknesses of the first and second gate dielectrics may be not equal to each other.

A semiconductor structure according to an embodiment of the present disclosure includes a first channel region (i.e., an upper portion of the first body region 32A) location in a semiconductor substrate (i.e., the substrate 8), a second channel region (i.e., an upper portion of the second body region 32B) located in the semiconductor substrate, a first gate dielectric (i.e., the gate dielectric layer 50 on the first body region 32A) located over the first channel region, and a second gate dielectric (i.e., the gate dielectric layer 50 on the second body region 32B) located over the second channel region. The first and second channel regions have different compositions. The first and second gate dielectrics have substantially same thickness. In one embodiment, the first channel region includes silicon, and the second channel region includes a silicon-germanium alloy including germanium at an atomic concentration greater than about 20%, and a difference between thicknesses of the second gate dielectric and the first gate dielectric is less than, or equal to, about 0.3 nm.

Figure 8:
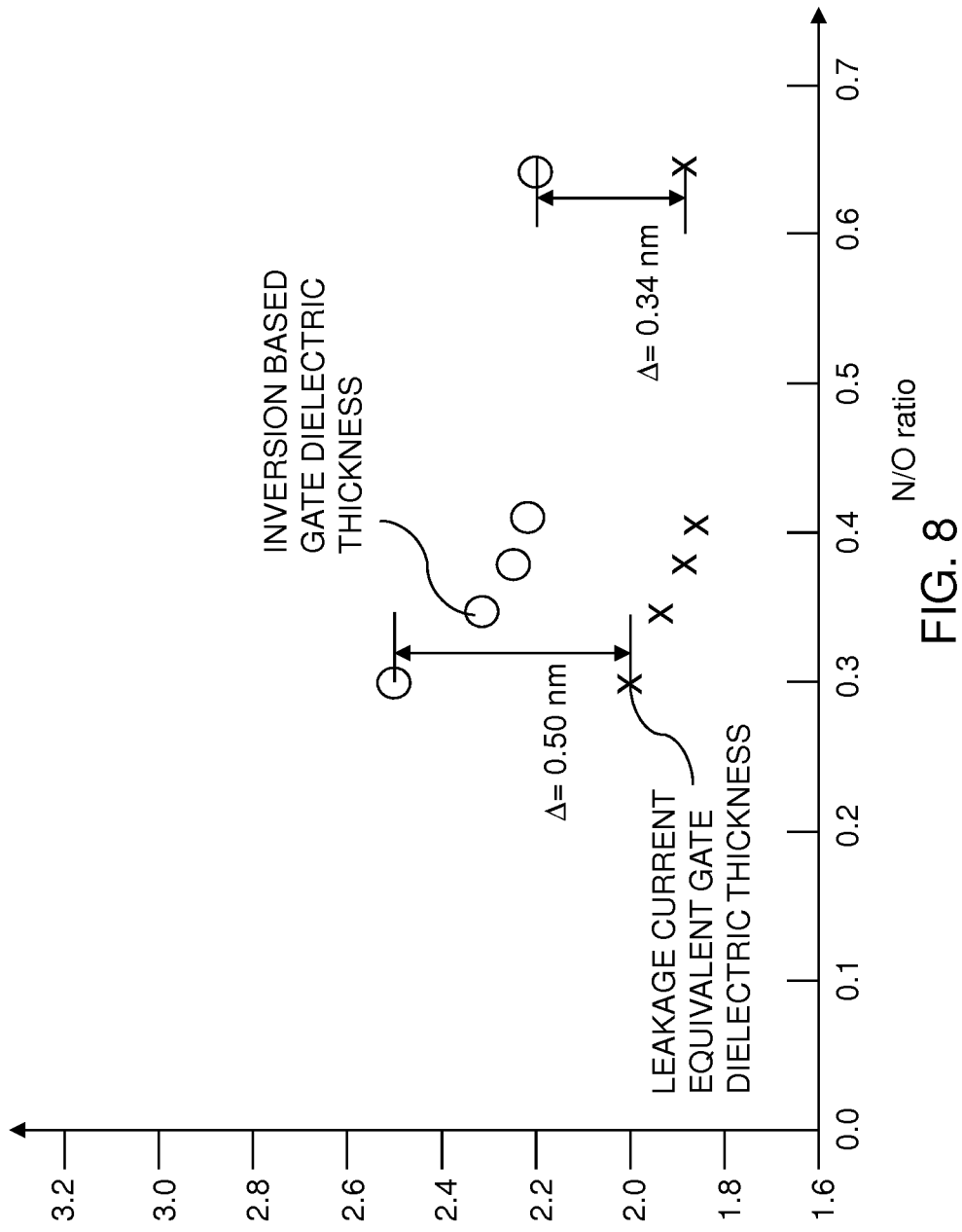
FIG. 8 is a graph illustrating the relationship between a leakage current equivalent dielectric thickness and an inversion based gate dielectric thickness of gate dielectrics including various ratios for nitrogen-to-oxygen atomic ratios according to an embodiment of the present disclosure.

Referring to FIG. 8, a graph illustrating the relationship between a leakage current equivalent dielectric thickness and an inversion based gate dielectric thickness of sample gate dielectrics formed by methods of the present disclosure. The sample gate dielectric has a range of values from 0.3 to 0.65 for the nitrogen-to-oxygen atomic ratio for the overall composition, i.e., for the ratio of y to x in the formula $SiO_xN_y$, that represents the average composition within each of the sample gate dielectrics.

The leakage current equivalent dielectric thickness represents the thickness of a thermal silicon oxide that provides an equivalent leakage current when used as a gate dielectric. The inversion based gate dielectric thickness of sample gate dielectrics represents the thickness of a thermal silicon oxide that provides an equivalent inversion charge when used as a gate dielectric. The difference between the inversion based gate dielectric thickness of sample gate dielectrics and the corresponding leakage current equivalent dielectric thickness is about 0.5 nm when the nitrogen-to-oxygen atomic ratio is 0.3, but decreases to values less than 0.4 nm when the nitrogen-to-oxygen atomic ratio is 0.35 or above. Thus, by selecting a value for the nitrogen-to-oxygen atomic ratio to be greater than 1/3, the difference between the inversion based gate dielectric thickness of sample gate dielectrics and the corresponding leakage current equivalent dielectric thickness can be significantly decreased relative to a gate dielectric having a nitrogen-to-oxygen atomic ratio of 0.3 or less. Thus, the gate dielectrics according to the present disclosure can provide a comparable level of inversion charge as prior art gate dielectrics, while providing a lesser electrical leakage than prior art gate dielectrics. Alternately, the gate dielectrics according to the present disclosure can provide a comparable level of leakage current as prior art gate dielectrics, while providing a greater amount of inversion charges than prior art gate dielectrics.

Figure 9:
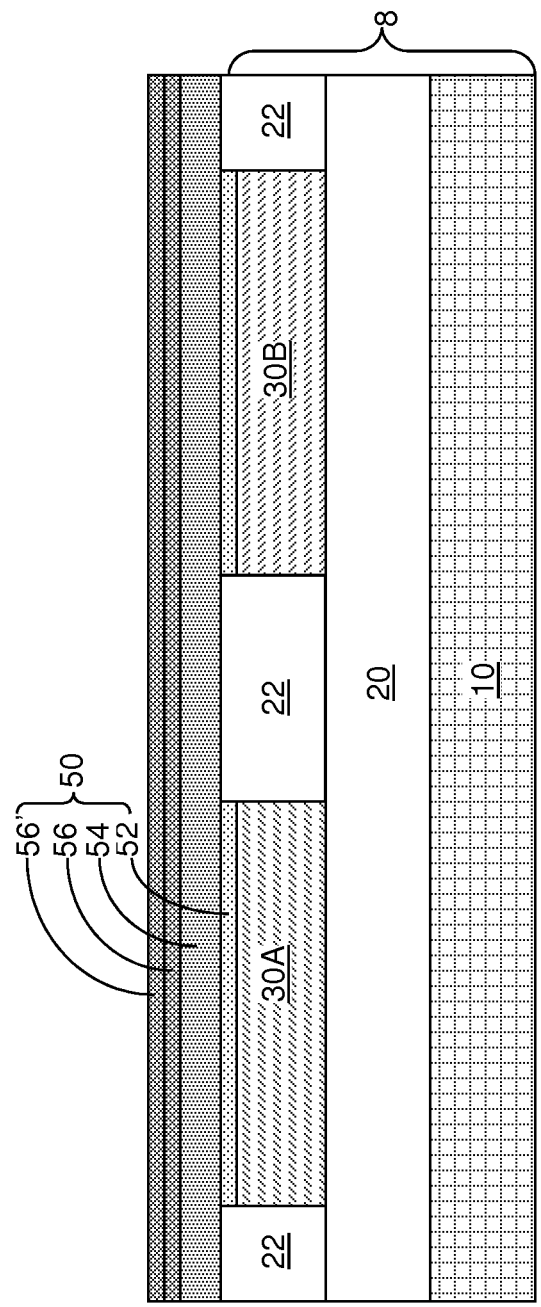
FIG. 9 is a vertical cross-sectional view of a variation of the exemplary semiconductor structure after formation of an additional silicon oxynitride material according to an embodiment of the present disclosure.

Referring to FIG. 9, a variation of the exemplary semiconductor structure can be derived by forming at least one additional silicon oxynitride material on the gate dielectric layer 50L of FIG. 6 to thicken the gate dielectric layer 50L further. In this case, at least once a series of processing steps can be performed after the conversion of the second silicon oxide material to form the second silicon oxynitride material layer 56. Each series of processing steps can include deposition of an additional silicon oxide material on an underlying surface of a silicon oxynitride material by an additional atomic layer deposition process, and subsequent conversion of the additional silicon oxide material into an additional silicon oxynitride material by an additional plasma nitridation process. The same ALD processes and the same plasma nitridation processes can be employed as in the processing steps of FIGS. 3-6. The gate dielectric layer 50L within an increased thickness can have the same average composition as the gate dielectric layer 50L shown in FIG. 6. The processing steps illustrated in FIG. 7 can be subsequently performed to form field effect transistors.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:

providing a semiconductor substrate including a first top semiconductor portion and a second top semiconductor portion, wherein said first top semiconductor portion and said second top semiconductor portion are separated by a trench isolation structure;

simultaneously converting an upper portion of said first top semiconductor portion into a first semiconductor oxynitride portion and an upper portion of said second top semiconductor portion into a second semiconductor oxynitride portion by performing an oxynitration anneal, wherein said first semiconductor oxynitride portion and said second semiconductor oxynitride portion have a topmost surface that is coplanar with a topmost surface of said trench isolation structure, and wherein said first semiconductor oxynitride portion and said second semiconductor oxynitride portion contain from 2 atomic % to 10 atomic % nitrogen;

depositing a first silicon oxide material over said first and second semiconductor oxynitride portions by a first atomic layer deposition process;

converting said first silicon oxide material into a first silicon oxynitride material employing at least a first plasma nitridation process;

depositing a second silicon oxide material on said first silicon oxynitride material by a second atomic layer deposition process; and converting said second silicon oxide material into a second silicon oxynitride material by a second plasma nitridation process, wherein a ratio of nitrogen atoms to oxygen atoms in a stack of said first and second silicon oxynitride materials is greater than 1/3.

2. The method of claim 1, wherein said first atomic layer deposition process employs at least 10 deposition cycles, wherein each deposition cycle comprising:

a silicon-containing precursor exposure phase in which a process chamber containing said semiconductor substrate includes a silicon-containing precursor gas; and an oxygen exposure phase in which said process chamber includes an oxygen-containing gas.

3. The method of claim 2, wherein said first atomic layer deposition process employs a number of deposition cycles, said number selected from a range from 12 to 20.

4. The method of claim 2, wherein said second atomic layer deposition process employs at least 4 deposition cycles.

5. The method of claim 2, wherein said process chamber is void of any oxygen-containing gas during said silicon-containing precursor phase, and is void of any silicon-containing gas during said oxygen exposure phase.

6. The method of claim 2, wherein a molecule of said silicon-containing precursor gas comprises at least one silicon atom and at least one hydrogen atom.

7. The method of claim 2, wherein said oxygen-containing gas is selected from $O_2$, $O_3$, and a combination of $O_2$ and $O_3$.

8. The method of claim 1, wherein said first and second plasma nitridation processes employ a plasma of a nitrogen-containing gas.

9. The method of claim 8, wherein said nitrogen-containing gas is selected from $N_2$, $NH_3$, $NO$, $N_2O$, $NO_2$, and combinations thereof.

10. The method of claim 1, wherein said ratio of nitrogen atoms to oxygen atoms is in a range from 1/3 to 0.70.

11. The method of claim 10, wherein said stack of said first and second silicon oxynitride materials has an overall composition of $SiO_xN_y$, wherein x/2+3y/4 is in a range from 0.75 to 1.25.

12. The method of claim 1, further comprising annealing said semiconductor substrate with said first silicon oxynitride material in an environment including a nitrogen-containing gas or an oxygen-containing gas at an elevated temperature in a range from 700 degrees Celsius to 1,100 degrees Celsius prior to said depositing of said second silicon oxide material.

13. The method of claim 1, wherein said converting is performed in an environment including an oxygen-containing gas or a nitrogen-containing gas at an elevated temperature in a range from 700 degrees Celsius to 1,100 degrees Celsius.

14. The method of claim 13, wherein said first and second semiconductor portions are each a silicon-containing material portion selected from a silicon portion and a silicon-germanium alloy portion.

15. The method of claim 1, further comprising performing at least once a series of processing steps after said converting of said second silicon oxide material, said series of processing steps comprising:
depositing an additional silicon oxide material on an underlying surface of a silicon oxynitride material by an additional atomic layer deposition process; and
converting said additional silicon oxide material into an additional silicon oxynitride material by an additional plasma nitridation process.

16. A method of forming a semiconductor structure comprising:
providing a semiconductor substrate including a silicon portion and a silicon-germanium alloy portion having germanium at an atomic concentration greater than 20%;
simultaneously converting a surface region of said silicon portion into a silicon oxynitride layer and a surface region of said silicon-germanium alloy portion into a silicon-germanium oxynitride layer,
depositing a first silicon oxide material on said silicon oxynitride layer and said silicon-germanium oxynitride layer by a first atomic layer deposition process;
converting said first silicon oxide material into a first silicon oxynitride material employing at least a first plasma nitridation process;
depositing a second silicon oxide material on said first silicon oxynitride material by a second atomic layer deposition process;
converting said second silicon oxide material into a second silicon oxynitride material by a second plasma nitridation process, wherein a ratio of nitrogen atoms to oxygen atoms in a stack of said first and second silicon oxynitride materials is greater than 1/3;
patterning a first stack of said silicon oxynitride layer, a first portion of said first silicon oxynitride material, and a first portion of said second silicon oxynitride material into a first gate dielectric; and
patterning a second stack of said silicon-germanium oxynitride layer, a second portion of said first silicon oxynitride material, and a second portion of said second silicon oxynitride material into a second gate dielectric, wherein a thickness differential between said second gate dielectric and said first gate dielectric is not greater than 0.3 nm.

17. The method of claim 16, wherein said simultaneously conversion of said surface region of said silicon portion and said surface region of said silicon-germanium alloy portion is performed by a thermal oxynitridation process employing an oxygen-and-nitrogen-containing gas or a combination of an oxygen-containing gas and a nitrogen-containing gas.

* * * * *